United States Patent [19]
Crabbé et al.

[11] Patent Number: 6,004,137
[45] Date of Patent: Dec. 21, 1999

[54] METHOD OF MAKING GRADED CHANNEL EFFECT TRANSISTOR

[75] Inventors: Emmanuel Crabbé, Chappaqua; Bernard Steele Meyerson; Johannes Maria Cornelis Stork, both of Yorktown Heights; Sophie Verdonckt-Vandebroek, Geneva, all of N.Y.

[73] Assignee: International Business Machines Corporation, Armonk, N.Y.

[21] Appl. No.: 08/126,125

[22] Filed: Sep. 23, 1993

Related U.S. Application Data

[60] Continuation of application No. 07/785,547, Oct. 31, 1991, abandoned, which is a division of application No. 07/639,625, Jan. 10, 1991, abandoned.

[51] Int. Cl.$^6$ ...................... H01L 21/265; H01L 21/8258
[52] U.S. Cl. ........................... 437/40; 437/110; 437/128
[58] Field of Search ............................ 437/40, 110, 128

[56] References Cited

U.S. PATENT DOCUMENTS

| | | | |
|---|---|---|---|
| 4,994,866 | 2/1991 | Awano | 357/16 |
| 5,019,882 | 5/1991 | Solomon et al. | 357/16 |
| 5,036,374 | 7/1991 | Shimbo | 357/16 |

FOREIGN PATENT DOCUMENTS 0323896  4/1992  European Pat. Off. .

OTHER PUBLICATIONS

The American Heritage Dictionary, Second College Edition, Boston: Houghton Mifflin Co., 1982, p. 957.

Kasper, E., "Growth and Properties of Si/SiGe Superlattices", MSS–II Proceedings, Kyoto, Japan, p. 703 (1985).

Kiehl, R.A., et al., "Device Physics of Quantum–Well Heterostructure MISFETS", *IEDM*, p. 70 (1987).

Pearsall, T.P., et al., "Enhancement and Depletion Mode p–channel $Ge_xSi_{1-x}$ Modulation Doped FETs", *IEEE Electron Device Letters*, EDL–7:308 (1986).

Lang, D.V., et al., "Measurement of the Band Gap of $Ge_xSi_{1-x}$/Si Strained Later Heterostrutures", *Appl. Phys. Lett.*, 47(12):1333 (1985).

Wang, P.J., et al., "Two–Dimensional Hole Gas in $Si/Si_{0.85}Ge_{0.15}$/Si Modulation–Doped Double Heterostructures", *Appl. Phys. Lett.*, 54(26):2701 (1989).

Taft, R.C., et al., "Fabrication of a p–channel BICFET in the $Ge_xSi_{1-x}$/Si System", *Int'l Electron Device Conf. Digest*, pp. 570–573 (1988).

Tiwari, S., et al., "Unpinned GaAs MOS Capacitors and Transistors", *IEEE Electron Device Letters*, 9(9):488 (1988).

*Primary Examiner*—John Niebling
*Assistant Examiner*—Richard A. Booth
*Attorney, Agent, or Firm*—Scully, Scott, Murphy & Presser

[57] ABSTRACT

A MISFET having a graded semiconductor alloy channel layer of silicon germanium in which the germanium is graded to a single peak percentage level. The single peak percentage level defines the location of the charge carriers within the layer. The transconductance of the device can be optimized by controlling the location of the carriers within the channel.

8 Claims, 5 Drawing Sheets

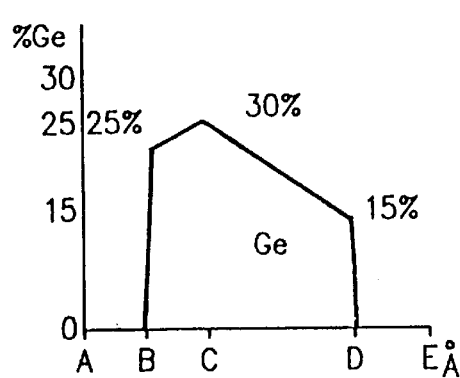
FIG.1(d)
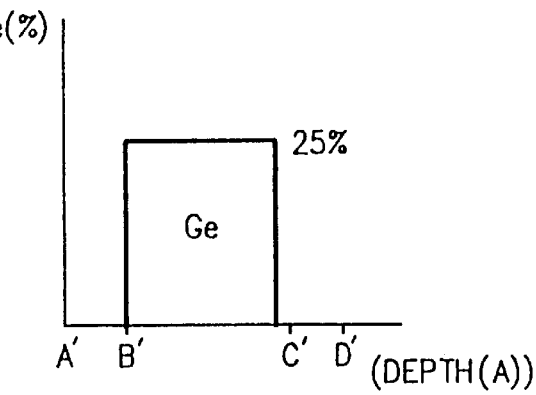
FIG.1(d')
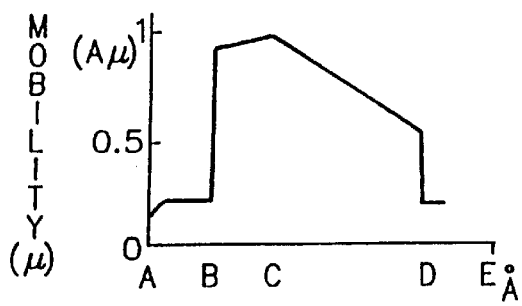
FIG.1(e)
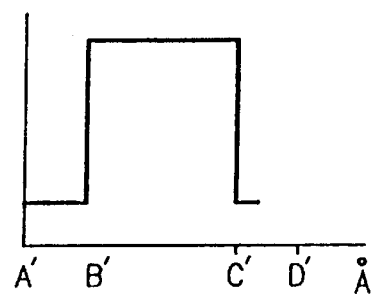
FIG.1(e')
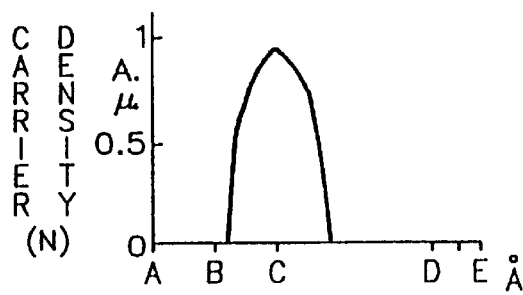
FIG.1(f)
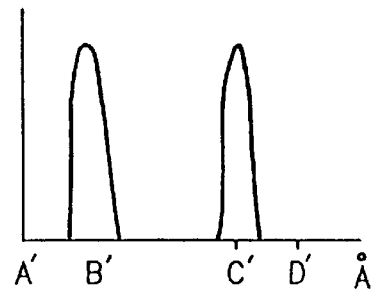
FIG.1(f')
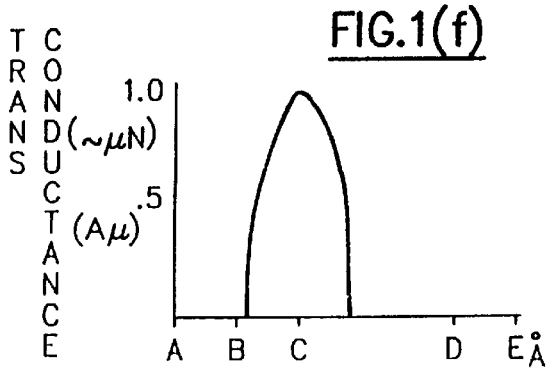
FIG.1(g)
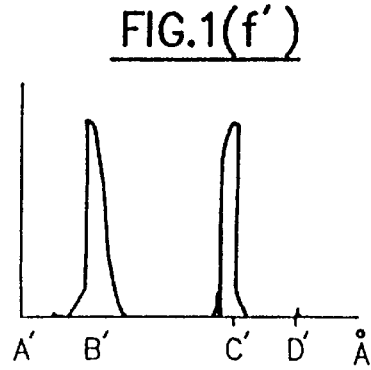
FIG.1(g')

METHOD OF MAKING GRADED CHANNEL EFFECT TRANSISTOR

This is a continuation of application Ser. No. 07/785,547 filed on Oct. 31, 1991, now abandoned, which is a divisional of application Ser. No. 07/639,625, filed on Jan. 10, 1991 now abandoned.

BACKGROUND OF THE INVENTION

1. Field of the Invention

This invention relates in general to semiconductor devices and in particular to a metal insulator field effect transistor having a graded silicon germanium channel for improved transconductance.

2. Description of the Prior Art

Field effect transistors are horizontal devices including a source, a drain spaced from the source and a gate disposed between the source and the drain. A channel region lies underneath the gate and between the source and the drain. A metal insulator field effect transistor (MISFET) has a metal electrode affixed to an insulator layer disposed on top of the channel. A voltage imposed upon the gate electrode controls the flow of current from the source to the drain within the channel.

One of the disadvantages of silicon as a semiconductor is its hole mobility compared to its electron mobility. The passage of electrons through silicon is limited by the crystal lattice structure. Other materials, such as germanium, have different energy band structures resulting in higher carrier mobilities. Such higher carrier mobilities are desirable because the mobility of carriers ultimately determines the switching speed of the device. The faster the switching speed, the more operations the given device can perform within a given unit of time.

Silicon-germanium alloys can be grown commensurate on a silicon substrate so long as the alloy layer is thin enough. See, T. P. Pearsall, and J. C. Bean, "Enhancement- and depletion-mode p-channel $Ge_xSi_{1-x}$ modulation doped FETs", IEEE Electron Device Letters, EDL-7, pp. 308–310, 1986, and R. C. Taft, J. D. Plummer and S. S. Iyer, "Fabrication of a p-channel BICFET in the $Ge_xSi_{1-x}/Si$ system", International Electron Device Conf. Digest, pp. 570–573, 1988. Since the lattice spacing of a crystal of germanium is larger than the lattice of a crystal of silicon, a layer that includes an alloy of germanium and silicon is placed under strain when grown comensurately. The germanium crystal lattice is compressed and provides a so-called pseudomorphic layer. See K. Casper, "Growth Improprieties of Si/SiGe Superlattices" MSS-II Proceedings, page 703, Kyoto, Japan, September 1975; D. V. Lang et al., "Measurement of the Band Gap of $Ge_xSi_{1-x}/Si$ Strained Layer Heterostructures", Applied Physics Letters, 47, page 1333 (1985). With such strained layers, several groups have demonstrated that two-dimensional electron and hole gas layers can be formed. It has recently been shown that the mobility of holes is higher in layers formed of an alloy of silicon and germanium than in pure silicon. See, P. J. Wang, et al., "Two-dimensional hole gas in $Si/Si_{0.85}Ge_{0.15}/Si$ modulation-doped double heterostructures", Appl. Phys. Lett. Vol. 54, No. 26, p. 2701 (1989).

It is possible that the hole mobility in such a system is enhanced by the strain in the alloy layer which decreases the energy of the light hole band relative to the heavy hole band. In that system, the conduction and valence band discontinuities are relatively low compared to III–V compound materials. In addition, small Schottky barriers heights on silicon would make commercial utilization of the MODFET devices of Pearsall et al. very difficult because of high gate leakage current, particularly at room temperature.

European Patent 0 323 896 AZ discloses a conventional MOSFET device which incorporates a germanium channel region formed of 90–100% Ge in Si alloy. The channel is symmetric, where at each edge of the channel there is an identical transition region from the 90–100% Germanium in Silicon alloy to the surrounding regions of pure Si. Graded regions are provided at each channel edge to accomodate the well known lattice mismatch between silicon and germanium, that mismatch being 4.0%. This results in the generation of in excess of several thousand billion defects per square centimeter in this mostly germanium layer due to the severe mismatch between this layer's lattice constant and that of the Si substrate. Such defects are well known to limit carrier mobility. Apart from this mechanical consideration, the Ge profile in the channel, as in all other known prior art, is symmetric and uniform throughout the mostly Ge region. Thus, two active transport regions will be formed at the edges of this channel, one at the transition from the silicon substrate to the 90–100% germanium channel, and the other at the transition region back to pure silicon at the surface of the device. Each transport region contains one hole gas, centered at each edge of the Ge plateau. Each hole gas has a finite spatial extent, such that half the carriers overlap the defected transition region beyond each plateau edge. This also degrades the mobility of carriers residing in these defected regions. Equally important, hole mobility decreases when holes travel in a region of reduced Ge content, as is the case in all prior SiGe channel MOSFET designs.

In U.S. patent application Ser. No. 07/351,630, filed May 15, 1989, now U.S. Pat. No. 5,019,882 and assigned to the same assignee as the present invention, there is disclosed a MOSFET having a SiGe channel layer grown on a Si substrate. A silicon cap layer separates the silicon dioxide insulator layer from the channel layer. A suitably applied voltage will result in a region of high mobility charge carriers at the interface between the SiGe alloy layer and the silicon cap layer. This region will contain a two-dimensional electron or hole gas. By forming the electron or hole gas at the SiGe/Si interface rather than the $Si/SiO_2$ interface as in previous devices, interface scattering is decreased or eliminated. The region of high mobility charge carriers is as near as possible to the gate (at the Si/SiGe interface), and thus the capacitance is maximized and device performance is enhanced. However, carrier mobility is actually at its lowest nearest the gate. Hence, the device transconductance, which is a figure of merit that is linearly proportional to both capacitance and mobility is not optimized. Furthermore, the channel region described in this earlier work is symmetric as in all known prior art. The abrupt transitions between silicon and silicon germanium regions in such a symmetric structure result in a number of carriers being transported outside of the channel region.

Thus, it is desirable to provide a MOSFET type device having a SiGe channel with optimized transconductance in order to increase the amount of current that can be passed through the device.

SUMMARY OF THE INVENTION

The present invention is directed to a MISFET having a graded semiconductor alloy channel layer wherein the grading results in the charge carriers being positioned within the channel layer at a location in which transconductance will be optimized. The MISFET of the present invention includes a strained, pseudomorphic, epitaxial channel layer of an alloy of a first semiconductor material and a second semiconductor material disposed over a substrate. The alloy has a percentage of the second semiconductor material graded within the channel layer to a single peak-percentage level such that the location of carriers within the channel layer coincides with the peak percentage level. An epitaxial cap layer of the first semiconductor material is disposed over the channel layer and a gate insulator layer is disposed over the cap layer. A gate electrode is disposed over the gate insulator layer and source and drain regions are formed in the cap layer and the channel layer on opposite sides of the gate electrode. In a preferred embodiment of the invention, the channel layer is formed of a silicon-germanium alloy on a silicon substrate.

The channel profile is graded to control the location of the charge carriers in the channel layer to maximize transconductance. The grading results in a built-in electric field which drives the carriers to the desired location in the channel. The graded alloy channel FET of the present invention avoids the problem of the two active transport regions formed in prior art devices, as only a single transport region is formed at the location of the single peak-percentage level of the second semiconductor material. In addition, in prior art SiGe channel devices, because the band offset between Si and SiGe is small, a two-dimensional hole gas formed at that interface will spill over into the Si layer, a layer of lesser mobility. In the FET of the present invention, this problem can be avoided by locating the carriers spaced from this interface in order to maintain all or substantially all of the hole gas within the SiGe higher mobility channel. The location of carriers within the channel can be controlled by grading the Ge concentration in silicon to a maximum with that maximum being located anywhere in the channel but spaced from either interface. The point of maximum concentration determines the location of the carriers. The particular location within the channel will depend on desired device characteristics.

In another preferred embodiment of the device of the present invention, a modulation doping technique is employed in which the carriers are located below the channel layer. First, a narrow in situ doped boron layer is grown. The total integrated dose, which can very accurately be controlled with low temperature epitaxy, determines the threshold voltage of the device. The doped layer is separated from the SiGe channel by a small undoped spacer, to physically separate the ionized acceptors from the holes in the SiGe channel. Thicker spacers can result in a deleterious parasitic substrate channel. Thus, a modulation doped metal insulator semiconductor device is formed.

By modulation doping the channel region of a MOSFET, the carriers are physically separated from the ionized atoms, thus allowing high carrier concentrations with negligible ionized impurity scattering and hence high mobilities compared to uniformly doped SiGe MOSFETS. In addition, by locating the dopant below the SiGe channel rather than above as in both the MODFET and the BICFET, the process sensitivity is greatly improved as thining of the Si cap layer during device fabrication does not affect the total integrated doping and thus the threshold voltage. An advantage over the uniformly doped SiGe MOSFET is that in the modulation doped device, the parasitic surface channel depends much less critically on the silicon cap thickness and hence on process variations. Finally, the modulation doped device maximizes the ratio of carriers in the SiGe channel over those in both the surface and substrate parasitic channels compared to the uniform SiGe MOSFET.

BRIEF DESCRIPTION OF THE DRAWINGS

FIGS. 1(d) through 1(g) show respectively a Ge content profile, carrier mobility, carrier density and transconductance of a graded SiGe channel layer of the present invention.

FIGS. 1(d') through 1(g') show respectively a Ge content profile, carrier mobility, carrier density and transconductance of a prior art flat Ge profile channel layer.

DETAILED DESCRIPTION OF THE INVENTION

The present invention is directed to a field effect transistor having a graded alloy channel in which one element of the alloy is graded to a single peak percentage level in the channel. The invention may be implemented in silicon or germanium materials or in III–V/II–VI material systems. For purposes of explanation, the invention will be described in silicon-germanium material systems on silicon substrates, but it will be understood by those skilled in the art that the concepts and teachings herein apply to the III–V/II–VI systems.

Figure 1A:
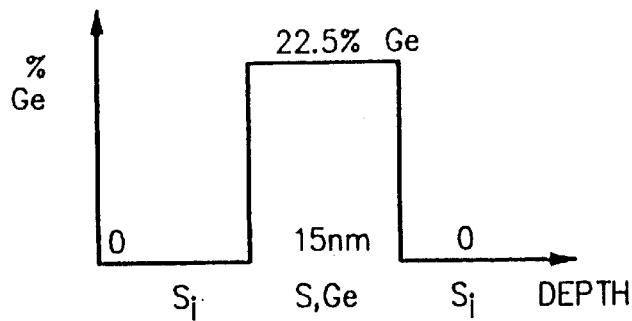
FIG. 1(a) shows the flat, symmetric germanium content profile of a prior art silicon-germanium channel layer.
Figure 1B:
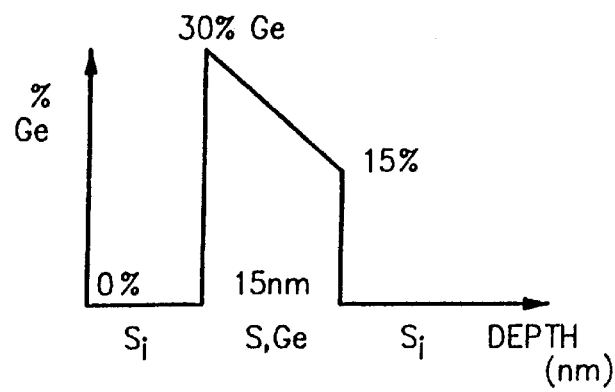
FIG. 1(b) shows one example of a graded germanium content profile of a silicon-germanium channel layer in accordance with the present invention.
Figure 1C:
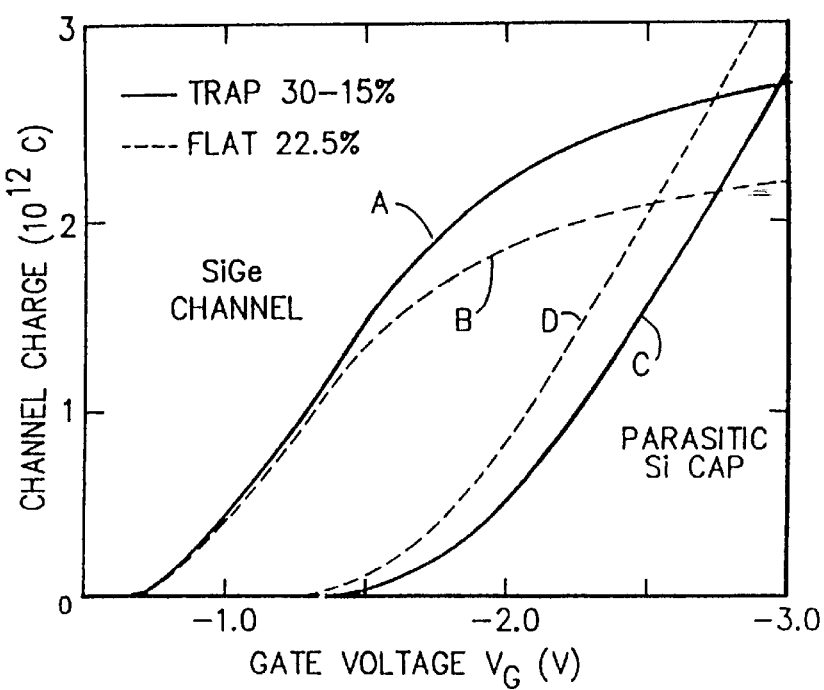
FIG. 1(c) compares channel charge vs. gate voltage curves for devices having profiles of FIGS. 1(a) and 1(b).

The graded channel FET of the present invention provides many advantages over devices having a conventional symmetric alloy percentage profile. These advantages will be described with reference to FIGS. 1(a), 1(b) and 1(c). FIG. 1(a) shows a conventional alloy percentage profile for a MOSFET having a SiGe channel layer sandwiched between layers of pure silicon. The channel layer, 15 nm thick, has a uniform Ge percentage of 22.5%. FIG. 1(b) shows a graded profile in accordance with the present invention. The percentage of Ge rises abruptly to 30% at the Si/SiGe interface and is graded down to 15% at the SiGe/Si interface. FIG. 1(c) shows the channel charge vs. Vg curves for MOSFETs with the profiles of FIGS. 1(a) and 1(b). For the same total integrated Ge dose the graded channel profile provides these advantages: (1) higher transconductance at low Vg as shown by the slope of curve A vs the slope of curve B which results in sharper turn-on; (2) higher current at higher Vg which results in better driving capability; and (3) less parasitic channel conduction in the Si cap layer as shown by the location of curve C vs. D.

FIGS. 1(d) and 1(d') show, respectively, the Ge profile in another embodiment of the present invention (FIG. 1(d)) and in the prior art (FIG. 1(d')). The units are A.U., e.g. Arbitrary Units. The labels A, B, C, D, E and A', B', C', D' indicate various points in the cross section of a FET structure having the respective profile. A–B is a layer of Si of 5 nm, B–C is about 7 nm of SiGe to the peak of 30% Ge and C–D is about 13 nm. D–E are various Si layers below the channel. A'–B' is a layer of Si of about 5 nm, B'–C' is a layer of SiGe with a uniform profile of 25% Ge, and C'–D' are various Si layers. FIGS. 1(e) and 1(e'), shows mobility as a function of depth for, respectively, the structure of the present invention and the prior art. FIGS. 1(f) and 1(f') show the location of carriers in each of the two cases when the devices are in the "on" state at low gate bias. Due to the shape of profile of FIG. 1(f), the maximum carrier density is located about point C, and remains trapped within the high mobility Ge channel, between points B and D. This is a single gas, and is in marked contrast to the case in FIG. 1(f'). To begin with, in a symmetric case as in FIG. 1(f'), two gases are formed, one centered at B', and the other at C'. This means that a large fraction of the carriers in each gas lie outside of the region of high mobility. For the gas at B', a large fraction lies in the region between A' and B', a region of low mobility. For the gas at C', there is again a large fraction of the gas located in region C'–D', again in a low mobility region. This is clear when one considers a figure of merit such as the product of the mobility times the carrier density. That product, which is proportional to the ultimate current that the device can switch, is shown in FIGS. 1(g) and 1(g'). In FIG. 1(g) which is the product of mobility of FIG. 1(e) times density FIG. 1(f), the transconductance is large, in that the mobility is high wherever the carrier density is high. Thus, all the carriers generated are highly mobile. In FIG. 1(g'), the product of mobility (FIG. 1(e')) times density (FIG. 1(e)) is lower, in that a large number of the carriers shown in FIG. 1(f') reside in regions of low mobility, thus contributing far less to the total conductivity.

Figure 2A:
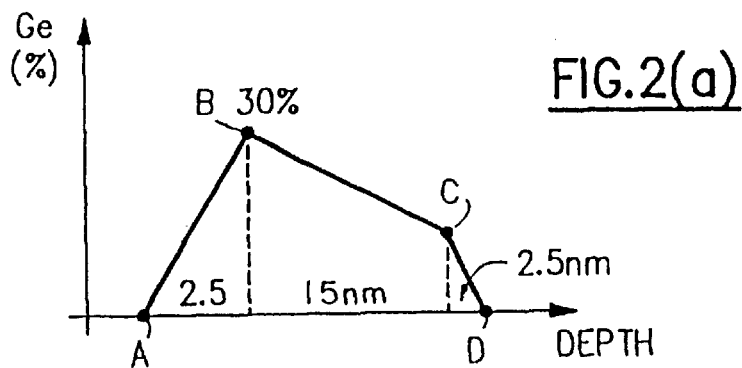
FIGS. 2(a) and 3(a) are two additional germanium content profiles of a silicon-germanium channel layer of the present ivention.
Figure 3A:
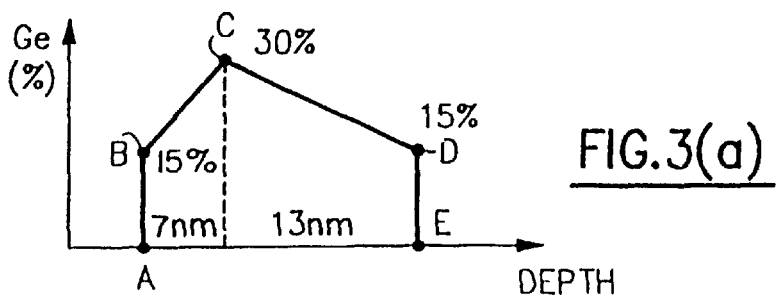

Examples of two other grading profiles are shown in FIGS. 2(a) and 3(a). The grading profile of FIG. 2(a) starts at the Si/SiGe interface at A and grades from zero % to 30% Ge at B, a distance of 2.5 nm from that interface. The Ge content grades down to 15% at C for a thickness of 15 nm and then grades down to zero % at D at the SiGe/Si interface. In the grading profile of FIG. 3(a), the Ge percentage rises abruptly from zero % at A, to 15% at B, the Si/SiGe interface. The profile is graded up to 30% at C for a thickness of 7 nm and grades down to 15% for a thickness of 13 nm at D. The profile then drops abruptly to zero % at E at the SiGe/Si interface. In the example of FIG. 2(a), capacitance will be high while mobility will be increased but not maximized as a fraction of the holes will spill over in the silicon. In the graded profile of FIG. 3(a), carrier mobility will be maximized as no holes spill over in the silicon, but capacitance will not be maximized. The particular location of the peak percentage of germanium, and hence the location of the charge carriers, will depend on the desired device characteristics.

Figure 2B:
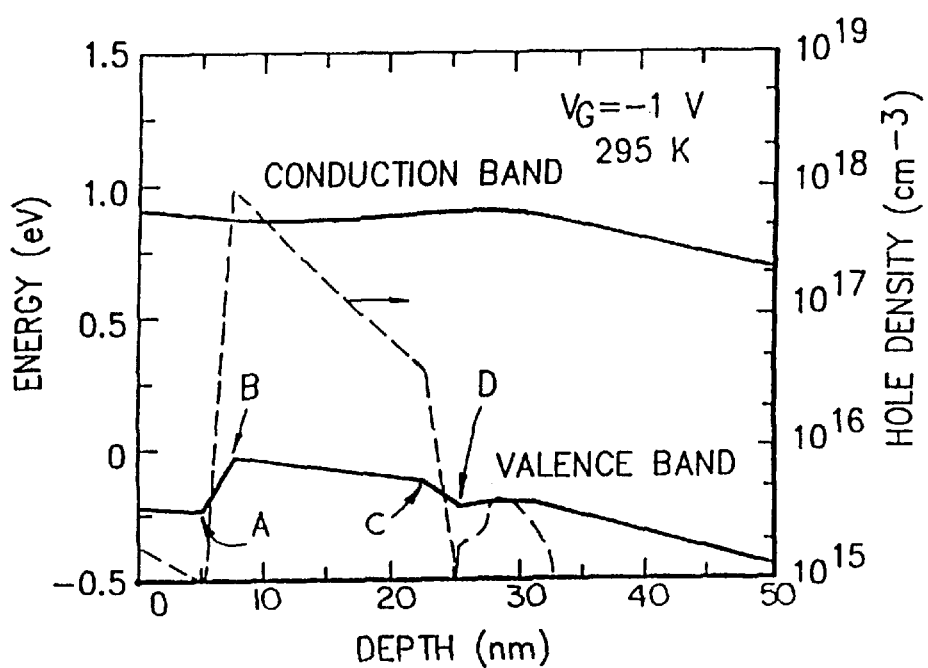
FIGS. 2(b) and 3(b) are energy band diagrams with the hole density profiles of devices of the present invention in which the channel layers have germanium content grading profiles as that shown in FIG. 2(a) and FIG. 3(a), respectively.
Figure 3B:
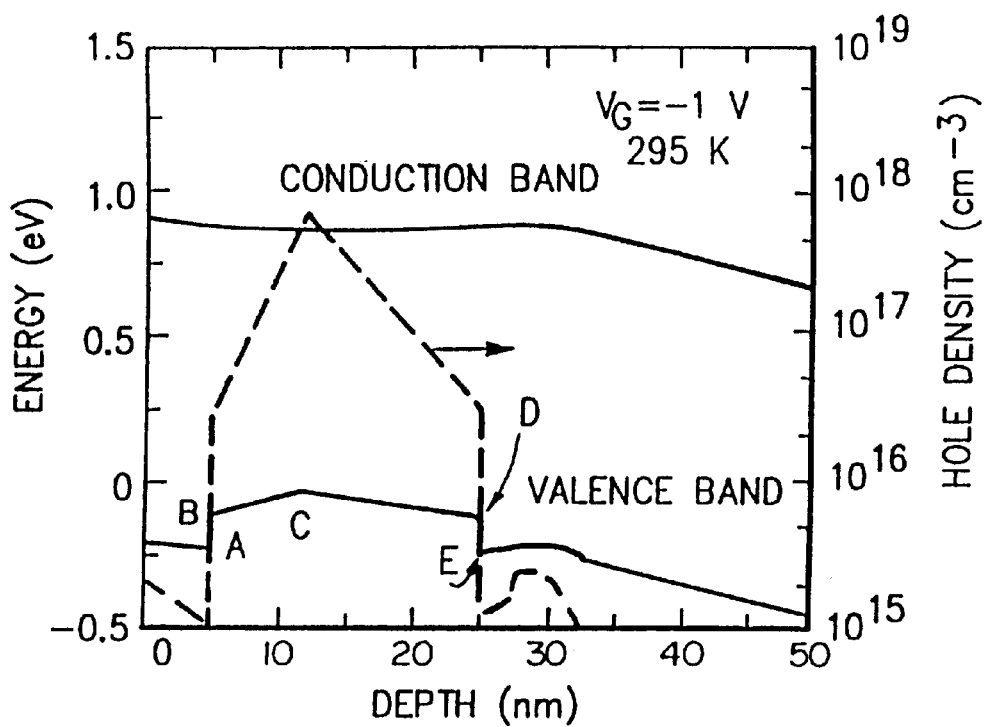

The control of the location of the charge carriers in the channel is shown by FIGS. 2(b) and 3(b). The band diagrams of FIGS. 2(b) and 3(b) correspond to devices having the germanium grading of FIGS. 2(a) and 3(a), respectively. The band diagrams are for a gate voltage of −1.0 volts. The hole density, shown superimposed on the band diagram shows that the location of the maximum concentration of carriers coincides with the location of the maximum percentage of germanium shown in FIGS. 2(a) and 3(a), respectively. The higher the average Ge concentration, the higher the ratio of mobile carriers in the SiGe channel compared to those in both parasitic surface and substrate channels, as illustrated in FIGS. 2(b) and 3(b).

Figure 4:
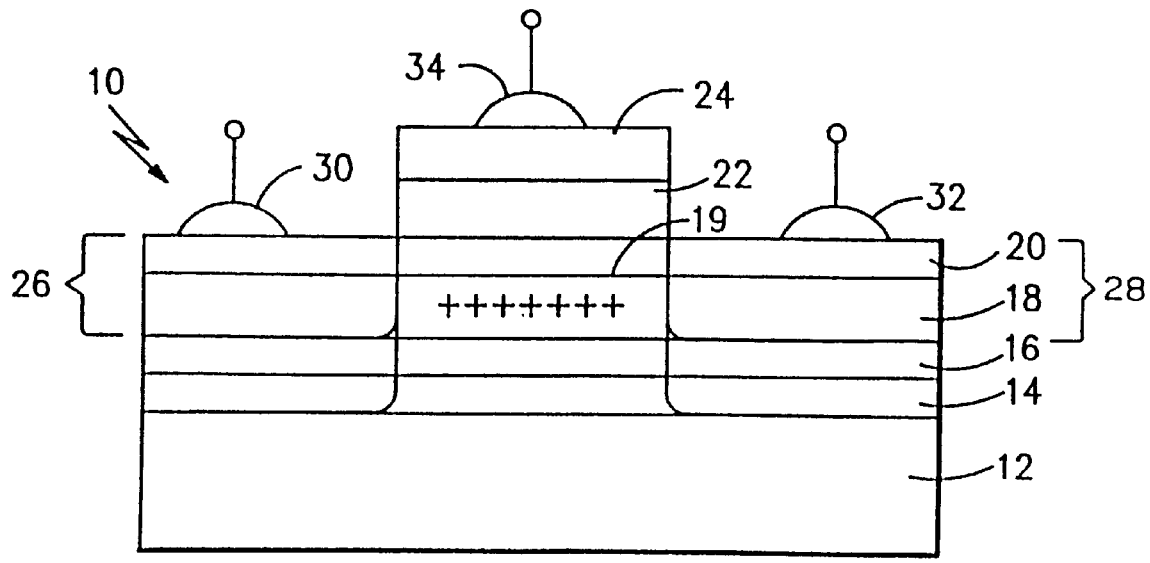
FIG. 4 is a cross-sectional diagram of a MODMOS of the present invention.

Referring now to FIG. 4 there is shown a modulation doped n+ polysilicon gate graded SiGe channel MISFET 10 of the present invention. As shown in FIG. 4, a substrate 12 of silicon is provided and a narrow in situ doped layer 14 of silicon is grown. For a p-channel MOSFET, boron doping is used. The total integrated dose of dopant determines the threshold voltage of the device. The integrated dose can be very accurately controlled if the layer 14 is deposited and doped in situ using low temperature epitaxy. Typical thickness of layer 14 is approximately 2 to 5 nm with a doping concentration of $5 \times 10^{18}$ cm$^{-3}$. A narrow undoped silicon spacer 16 is grown on the doped layer 14 typically to a thickness of about 2 nm. The undoped spacer physically separates the ionized acceptors from the 2D hole gas flowing in the SiGe channel. If thicker spacers are used, a deleterious parasitic substrate channel may result.

The various layers of the device may be grown by a low temperature epitaxy process such as ultra high vacuum chemical vapor deposition or by molecular beam epitaxy.

Next, the undoped SiGe channel layer 18 is grown on the spacer layer 16. The SiGe channel layer is grown with a graded profile which is selected to maximize transconductance. Layer 18 is grown to a suitable thickness, and thin enough, to maintain a pseudomorphic monocrystalline structure, and may range in thickness from 10 to 50 nm.

A silicon cap layer 20 is deposited on the SiGe channel layer 18 typically 2 to 5 nm thick. A gate insulator layer 22, typically of silicon dioxide, is formed on cap layer 20 and a gate electrode layer 24 which typically may be a layer of polysilicon is formed on the gate insulator layer 22. Layers 22 and 24 are typically patterned by well known photolithographic masking and etching techniques. The source and drain regions 26 and 28 are formed by implantation or outdiffusion and are heavily doped with boron. Contacts 30, 32 and 34 are formed on the source, drain and gate regions to complete the device. Typical thicknesses for layer 22 are 3 to 10 nm and for layer 24, 50 to 200 nm.

The percentage of germanium in the silicon-germanium alloy layer 18 is graded within the channel layer to a single peak percentage level. The location of carriers within the channel layer will coincide with this peak percentage level. The SiGe channel layer 18 is thereby formed with a Ge profile designed to maximize transconductance. The Ge profile results in built-in electric field which locates the carriers in the desired position in the channel. The Ge percentage is about 50% or less at the peak. Typically, the percentage may range between 10 and 50%. Preferably, the maximum percentage level of Ge will be about 30%.

A large valence band discontinuity is desirable at the bottom and top of the channel in order to confine all the mobile carriers in the SiGe channel and suppress flow of carriers in the parasitic channels either at the insulator/Si interface or in the heavily doped region in the silicon under the SiGe channel. Accordingly, the electric field established by the negative voltage on gate 24 attracts a large number of positive carriers to interface 19 between SiGe layer 18 and the Si layer 20. This concentration of positive carriers or holes assumes a two-dimensional configuration. At the strained interface of the two crystalline layers, positive charge carriers at the interface have a high mobility and move in a substantially two-dimensional direction between source 26 and drain 28. When a two-dimensional hole gas is formed at the interface 19, the capacitance of the device will be maximized because it is as close to the gate as possible. However, the carrier mobility is decreased at this interface because of a large amount of holes spilling over into the silicon where they have low mobility. It is therefore desirable in order to maximize transconductance to locate the two-dimensional hole gas at a position spaced from the interface 19. Such a result is obtained by locating the peak percentage level of germanium spaced from interface 19.

Moreover, by modulation doping the channel region of a MOSFET as shown in the illustrative embodiment of FIG. 4, the carriers are physically separated from the ionized atoms, thus allowing high carrier concentrations with negligible ionized impurity scattering and hence high mobilities compared to uniformly doped SiGe MOSFETs. In addition, by locating the dopant below the SiGe channel rather than above as in both the MODFET and the BICFET, the process sensitivity is greatly improved as thining of the Si cap layer 20 during device fabrication does not affect the total integrated doping. An advantage over the uniformly doped SiGe MOSFET is that in the MODMOS, the parasitic surface channel depends much less critically on the silicon cap thickness and hence on process variations. Finally, the MODMOS maximizes the ratio of carriers in the SiGe channel over those in both the surface and substrate parasitic channels compared to the uniformly doped SiGe MOSFET.

To minimize processing temperatures to reduce diffusion of the doping species towards the undoped SiGe channel, deposited insulators such as a low temperature oxide are preferable for the gate. The correct threshold voltage is obtained by using $n^+$ polysilicon as gate material ($p^+$ polysilicon would result in a depletion mode device).

Figure 5A:
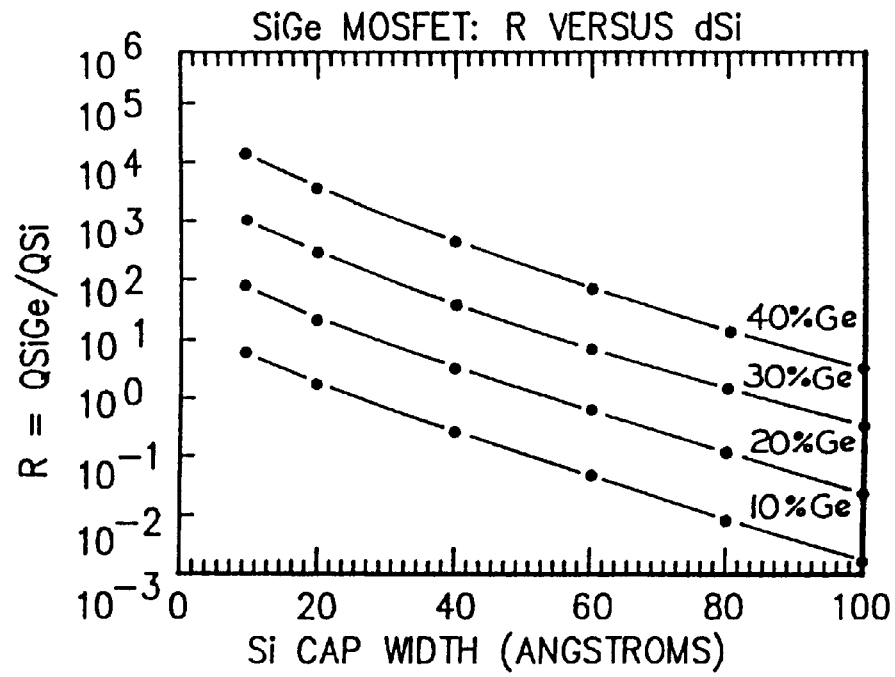
FIGS. 5a and 5b show a comparison of certain device data for a prior art SiGe MOSFET and a graded channel FET of the present invention.
Figure 5B:
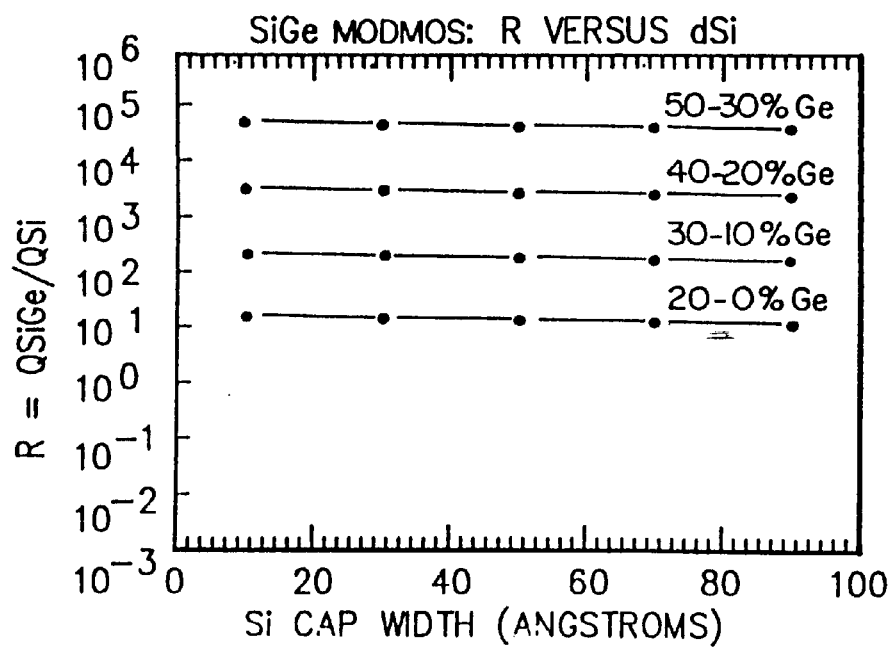

FIGS. 5(a) and 5(b) show various device data that may be obtained from a modulation doped graded SiGe channel MOSFFT of the present invention as compared to a uniformly doped SiGe MOSFET with the same Ge profile. FIGS. 5a and 5b show the dependence of the ratio of the charge in the SiGe channel over the charge in the parasitic surface and substrate channels on the Si cap thickness for respectively a uniformly doped $p^+$ polysilicon gate SiGe MOSFET, and for the p-MODMOS. The uniformly doped SiGe MOSFET has a flat Ge profile with Ge contents of 10, 20, 30 and 40%. The MODMOS has a graded Ge profile with peak percentages of 20, 30, 40 and 50%, in which the Ge % drops by 20% between top and bottom of the channel. The MODMOS is clearly much less sensitive to variations in the silicon cap thickness when FIGS. 5(a) and 5(b) are compared.

As noted earlier the graded alloy channel of the present invention may also be implemented in other FET configurations. For example, in the MODMOS of FIG. 4, the modulation doping may be provided above the channel by heavily doping the silicon cap layer 20 with p type dopant to about $5 \times 10^{18}$ cm$^{-3}$ for about 2 nm and also providing a silicon spacer layer between the doped layer and the channel. Layer 14 would not be present in this embodiment.

A MOSFET could be implemented by providing a p+ polysilicon gate and all remaining layers undoped or alternatively all remaining layers uniformly n doped, typically to $2 \times 10^7$ cm$^{-3}$.

Another MOSFET embodiment could be implemented in which n type doping is provided in either the silicon cap layer 20 with a silicon spacer separating the cap from the channel, or, the n type doping could be provided in layer 14. In both of these embodiments, a p+ gate is provided.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by Letters Patent is:

1. A process for fabricating a modulation doped MOSFET comprising the steps of:

forming a monocrystalline substrate of a first semiconductor material;

forming a strained, pseudomorphic, monocrystalline, undoped epitaxial channel layer over said substrate to define a first interface therebetween, said channel layer comprising an alloy of said first semiconductor material and a second semiconductor material, said channel being formed by grading said alloy such that the concentration of said second semiconductor material with respect to said first semiconductor material is increased to a single peak percentage level to provide a single active transport region located within said channel layer that coincides with said peak percentage level, the concentration of said second semiconductor material with respect to said first semiconductor being asymmetric relative to said peak percentage level;

forming an epitaxial cap layer of said first semiconductor material on said channel layer to define a second interface therebetween;

forming a gate insulator layer on said cap layer;

forming a gate electrode on said gate insulator layer; and, forming source and drain regions of one conductivity type in said cap layer and said channel layer, and on opposite sides of said gate electrode.

2. The process of claim 1 wherein the step of forming said channel layer includes the step of forming a single peak percentage level of said second semiconductor material in said alloy in the range between 10 to 50%.

3. The process of claim 2 wherein said single peak percentage level of said second semiconductor material in said alloy is about 30%.

4. The process of claim 1 wherein said single peak percentage level is positioned at a location between said first and second interfaces, said location being selected to optimize carrier transconductance within said channel layer.

5. The process of claim 1 wherein said alloy is GeSi in which the single peak percentage level of germanium in said alloy is in the range between 10 to 50%.

6. The process of claim 5 wherein said insulator layer is silicon dioxide.

7. The process of claim 1 further including the step of forming an epitaxial layer of said first semiconductor material heavily doped with the one conducting type on said substrate, and forming an epitaxial spacer layer of said first semiconductor material between said channel layer and said heavily doped layer.

8. The process of claim 1 wherein said said single peak percentage level is located at or adjacent either of said first and second interfaces.

* * * * *

UNITED STATES PATENT AND TRADEMARK OFFICE
CERTIFICATE OF CORRECTION

PATENT NO. : 6,004,137
DATED : December 21, 1999
INVENTOR(S) : Emmanuel Crabbe, et al.

It is certified that error appears in the above-identified patent and that said Letters Patent are is hereby corrected as shown below:

Column 7, line 32: "MOSFFT" should read --MOSFET--

Column 7, line 57: "$2x10^7$" should read --$2x10^{17}$--

Signed and Sealed this

Sixteenth Day of January, 2001

Attest:

Q. TODD DICKINSON

Attesting Officer

Commissioner of Patents and Trademarks